(12) United States Patent
Rahman et al.

(10) Patent No.: US 8,866,304 B2
(45) Date of Patent: Oct. 21, 2014

(54) INTEGRATED CIRCUIT DEVICE WITH STITCHED INTERPOSER

(71) Applicant: Altera Corporation, San Jose, CA (US)

(72) Inventors: Arifur Rahman, San Jose, CA (US); Wai-Bor Leung, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/725,591

(22) Filed: Dec. 21, 2012

(65) Prior Publication Data

US 2014/0175666 A1   Jun. 26, 2014

(51) Int. Cl.
*H01L 23/48* (2006.01)
*H01L 23/538* (2006.01)
*H05K 1/11* (2006.01)
*H01L 21/78* (2006.01)

(52) U.S. Cl.
CPC .............. *H01L 23/5384* (2013.01); *H05K 1/11* (2013.01); *H01L 21/78* (2013.01)
USPC ..... 257/774; 257/698; 257/777; 257/E23.011

(58) Field of Classification Search
CPC ..... H01L 23/48; H01L 25/065; H01L 23/498; H01L 23/147
USPC ............. 257/698, 774, 777, E23.011
See application file for complete search history.

(56) References Cited

U.S. PATENT DOCUMENTS

| | | | |
|---|---|---|---|
| 2007/0159611 A1* | 7/2007 | Goldstein et al. | 355/53 |
| 2013/0320565 A1* | 12/2013 | Griswold | 257/777 |
| 2013/0333921 A1* | 12/2013 | Hisamura | 174/250 |
| 2014/0035093 A1* | 2/2014 | Pincu et al. | 257/506 |
| 2014/0048928 A1* | 2/2014 | Li et al. | 257/737 |

* cited by examiner

*Primary Examiner* — Andy Huynh
(74) *Attorney, Agent, or Firm* — Fletcher Yoder, P.C.

(57) ABSTRACT

Systems, methods, and devices are provided to enable an integrated circuit device of relatively higher capacity. Such an integrated circuit device may include at least two component integrated circuits that communicate with one another. Specifically, the component integrated circuits may communicate through a "stitched silicon interposer" that is larger than a reticle limit of the lithography system used to manufacture the interposer. To achieve this larger size, the stitched silicon interposer may be composed of at least two component interposers, each sized within the reticle limit and each separated from one another by a die seal structure.

19 Claims, 5 Drawing Sheets

INTEGRATED CIRCUIT DEVICE WITH STITCHED INTERPOSER

BACKGROUND

This disclosure relates to integrated circuit devices and, more particularly, integrated circuit devices with component integrated circuits that communicate via a stitched silicon interposer.

This section is intended to introduce the reader to various aspects of art that may be related to various aspects of these techniques, which are described and/or claimed below. This discussion is believed to be helpful in providing the reader with background information to facilitate a better understanding of the various aspects of this disclosure. Accordingly, it should be understood that these statements are to be read in this light, and not as admissions of prior art.

Integrated circuit devices are found in a variety of electronic systems. Computers, handheld devices, portable phones, televisions, industrial control systems, and robotics, to name just a few, rely on integrated circuits. Because simply manufacturing larger and larger integrated circuits may exponentially reduce yields, many smaller integrated circuits may operate together to perform certain data processing operations. For example, a field programmable gate array (FPGA) chip may communicate with a memory chip to carry out certain data processing. In another example, several FPGA chips may operate together to carry out operations not possible with only one chip.

Many intercommunication schemes have been developed to improve the bandwidth and efficiency of communication between two integrated circuits. In one example, integrated circuits may be stacked and communicate with one another though wire bonding. Wire bonding, however, provides a limited number of chip-to-chip interconnects of relatively low bandwidth and efficiency. Another chip integration scheme to permit intercommunication between two integrated circuits involves a silicon interposer. A silicon interposer provides a silicon substrate patterned with chip-to-chip interconnects at various depths. Two or more component integrated circuits are bonded to the silicon interposer. The component integrated circuits can then communicate over the chip-to-chip interconnects at much higher bandwidth and efficiency than wire bonding.

A silicon interposer may be manufactured by patterning a silicon wafer using a lithography system. Lithography systems typically have a maximum size that each die on a silicon wafer can be made. This maximum patterning size is referred to as the "reticle limit" of the lithography system. Any single interconnect pattern, or mask database, patterned onto the wafer cannot exceed the reticle limit. As such, the size of the interposer has conventionally remained within the reticle limit of the lithography system used to manufacture the interposer. The size of the interposer limits the number and size of the component integrated circuits that can be installed on the interposer. Still, integrated circuit devices of higher capacity than possible within the reticle limit are desired.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of this disclosure relate to systems, devices, and methods involving integrated circuit that communicate using a silicon interposer larger than a reticle limit of the lithography system used to manufacture the interposer. To overcome the reticle limit, the interposer may be a "stitched silicon interposer." In this disclosure, a stitched silicon interposer is an interposer made up of multiple component interposers. Each of these component interposers falls within the reticle limit, though the total size of the stitched silicon interposer may be much greater. Each component interposer may be patterned individually, separated from one another by a die seal structure. Thus, for instance, an integrated circuit device according to this disclosure may include two or more component integrated circuits that communicate via chip-to-chip interconnects of the component interposers. The component integrated circuits and the component interposers may be designed to operate with one another despite that the chip-to-chip interconnects of the component interposers cannot cross between the two component interposers.

Various refinements of the features noted above may exist in relation to various aspects of this disclosure. Further features may also be incorporated in these various aspects as well. These refinements and additional features may exist individually or in any combination. For instance, various features discussed below in relation to one or more of the illustrated embodiments may be incorporated into any of the above-described aspects of this disclosure alone or in any combination. The brief summary presented above is intended only to familiarize the reader with certain aspects and contexts of embodiments of this disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of this disclosure will be described below. These described embodiments are only examples of the disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of this disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of this disclosure are not intended to be interpreted as excluding the existence of additional embodiments that also incorporate the recited features.

This disclosure relates to integrated circuit devices with component integrated circuits that intercommunicate using a silicon interposer larger than a reticle limit of the lithography system used to pattern the interposer. The component integrated circuits may intercommunicate over chip-to-chip interconnects within the interposer. The interposer may have numerous chip-to-chip interconnects that can operate at a higher bandwidth and higher efficiency than wire bonding. Although the yields available for the component integrated circuits placed on the interposer may drop drastically with an increase in the die size, the yield for silicon interposers, which may be much simpler than the component integrated circuits, may be much greater. Thus, the size of a given interposer that can be patterned using a lithography system may be limited not by yield, but rather the reticle limit. As discussed above, lithography systems typically have a maximum size that each die on a silicon wafer can be made. This maximum patterning size is referred to as the "reticle limit" of the lithography system.

The integrated circuit devices of this disclosure use an interposer that is larger than the reticle limit. This larger interposer is formed by "stitching" two or more component interposers that respectively fall within the reticle limit. The two component interposers may not share any chip-to-chip interconnects. As such, the component integrated circuits that are disposed onto the component interposers of the stitched interposer may be co-architected with the interposer mask databases of the two component interposers of the stitched interposer. Due to the larger size of the stitched silicon interposer compared to conventional silicon interposers, the integrated circuit device may have a higher capacity than otherwise.

Figure 1:
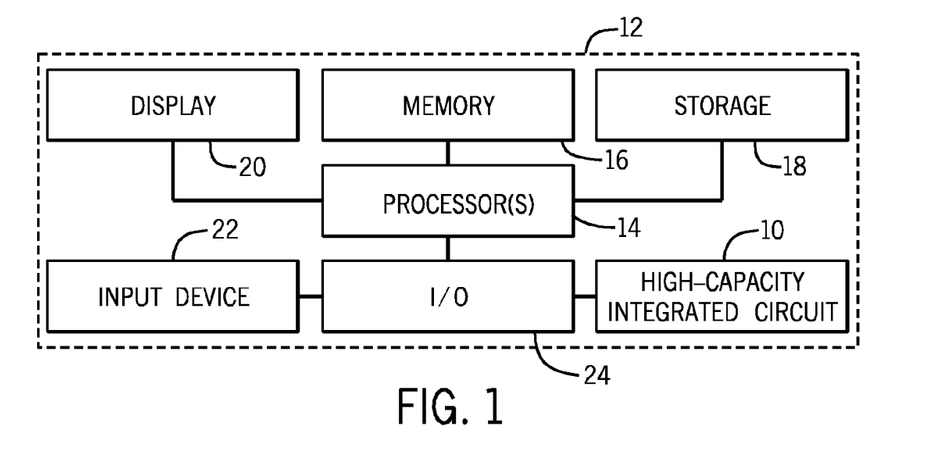
FIG. 1 is a block diagram of a system that includes a high-capacity integrated circuit device using an interposer larger than a reticle limit of the lithography system used to manufacture the interposer, in accordance with an embodiment.

Such a high-capacity integrated circuit device 10 may be employed in any number of electronic devices, including an electronic device 12, shown in FIG. 1. The high-capacity integrated circuit device 10 may employ a stitched silicon interposer that is larger than the reticle limit of the lithography system used to pattern the interposer. The electronic device 12 represents only one example of a system that may employ the high-capacity integrated circuit device 10.

In the example of FIG. 1, the electronic device 12 includes processor(s) 14, memory 16, storage 18, a display 20, and input device 22 coupled to an input/output (I/O) port 24. The high-capacity integrated circuit device 10 is meant to represent any suitable integrated circuit device 10 that could be employed by the electronic device 12. For example, the high-capacity integrated circuit device 10 may represent a programmable logic device (PLD), an application specific integrated circuit (ASIC), a component of a peripheral device, an industrial control logic circuit, a co-processor, or any other suitable integrated circuit device. Indeed, in some embodiments, other components of the electronic device 12, such as the processor(s) 14, the memory 16, the storage 18, and/or the I/O ports 24 may form the high-capacity integrated circuit device 10. Some or all of these components may be disposed on a stitched silicon interposer larger than the reticle limit, for example, in a "system-on-a-chip" (SOC). It may be appreciated that the electronic device 12 may represent any number of electronic devices, such as a computer, a handheld electronic device, a portable phone, a media player, a television, an industrial control device, a digital camera, or a household electronic appliance, to name only a few.

Figure 2:
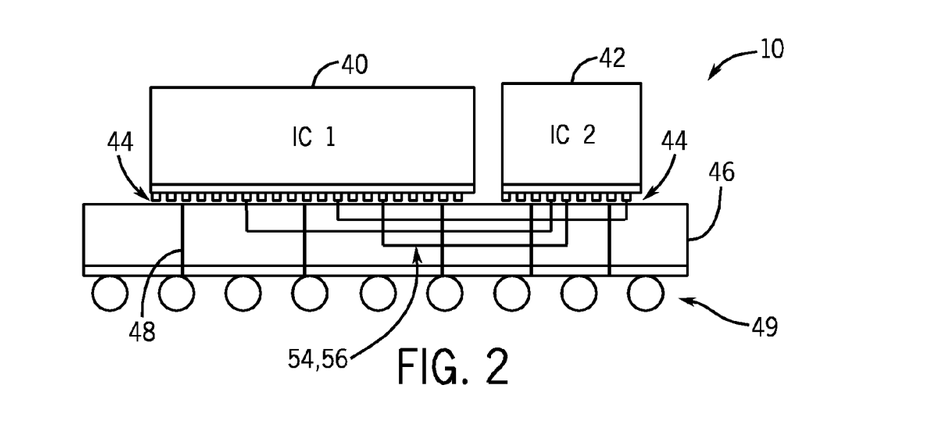
FIG. 2 is a side view of a block diagram of the high-capacity integrated circuit, in accordance with an embodiment.

The high-capacity integrated circuit device 10 may have a higher capacity than otherwise by combining several component integrated circuits on an interposer larger than the reticle limit. FIG. 2, for example, provides a side view of a block diagram of the high-capacity integrated circuit device 10. In the example of FIG. 2, a first component integrated circuit (IC1) 40 may communicate with a second component integrated circuit (IC2) 42 through hundreds, thousands, tens of thousands, or more microbumps 44 joined to a stitched silicon interposer 46. The microbumps 44 connect the component integrated circuits 40 and 42 to chip-to-chip interconnects 54, 56 (also seen in FIGS. 3 and 4, discussed below) within the stitched silicon interposer 46. These chip-to-chip interconnects 54, 56 provide communication channels through various depths of the stitched silicon interposer 46.

The component integrated circuits 40 and 42 may be attached to the stitched silicon interposer 46 through chip-to-chip bonding via the microbumps 44. In certain embodiments, the microbumps 44 may have a pitch of between approximately 30-50 μm. Through-silicon vias (TSVs) 48 may connect certain of the microbumps 44 and/or chip-to-chip interconnects to C4 interconnects 49. The C4 interconnects 49 may have a pitch of between approximately 100 μm-250 μm.

The component integrated circuits 40 and 42 may be any suitable discrete integrated circuit dice. In one example, the first component integrated circuit 40 may be a primary die, and the second component integrated circuit 42 may be a daughter die that supports the operation of the primary die. The first component integrated circuit 40 may represent, for example, a field programmable gate array (FPGA), a microprocessor, or a digital signal processor (DSP). In support of the first component integrated circuit 40, the second component integrated circuit 42 may represent a memory device, an analog-to-digital converter (ADC), a digital-to-analog converter (DAC), an optical signal processor, a mixed signal processor, or any other suitable integrated circuit. In other examples, the first and second component integrated circuits 40 and 42 may represent both primary dice or both daughter dice. For example, the high-capacity integrated circuit device 10 may include multiple FPGA chips or multiple memory devices. Additionally, though the high-capacity integrated circuit device 10 is shown to include only two component integrated circuits 40 and 42, any suitable number of component integrated circuits may be bonded to the stitched silicon interposer 46 to form the high-capacity integrated circuit device 10.

Figure 3:
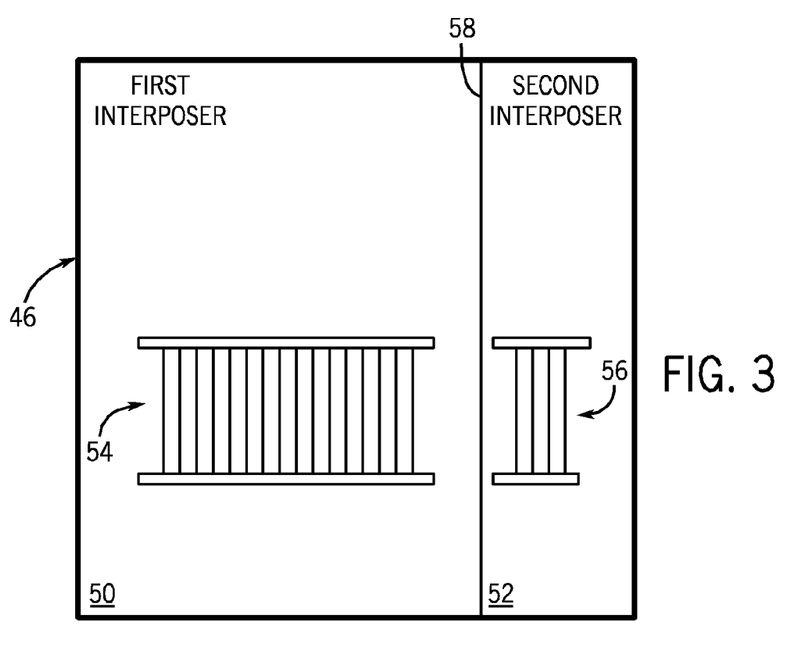
FIG. 3 is a top view of a block diagram of the interposer larger than the reticle limit, which includes two component interposers each within the reticle limit, in accordance with an embodiment.

A top view of the stitched silicon interposer 46 appears in FIG. 3. As seen in FIG. 3, the stitched silicon interposer 46 includes a first component interposer 50 and a second component interposer 52. The first component interposer 50 includes a number of chip-to-chip interconnects 54 schematically shown to join two different areas of the first component interposer 50. Likewise, the second component interposer 52 includes its own respective chip-to-chip interconnects 56. Although the first component interposer 50 is shown to be larger than the second component 52, the component interposers 50 and 52 may be the same size in other embodiments. Moreover, the chip-to-chip interconnects 54 may derive from an interposer mask database that specifies the location of the chip-to-chip interconnects 54. In the example of FIG. 3, the interposer mask database used to generate the chip-to-chip interconnects 54 of the first component interposer 50 is different from the interposer mask database used to generate the chip-to-chip interconnects 56 of the second component interposer 52. In other embodiments, however, the same interposer mask database may be used to generate both the chip-to-chip interconnects 54 and 56.

As also seen in FIG. 3, the first component interposer 50 and the second component interposer 52 are separated from one another by a die seal structure 58. The die seal structure 58 should be understood to fully surround the first component interposer 50 and the second component interposer 52. The die seal structure 58 may be understood to form a component of a wafer acceptance test (WAT) structure. The die seal structure 58 separates the individual structures patterned in the first component interposer 50 from those patterned in the second component interposer 52. Thus, the chip-to-chip interconnects 54 and 56 never cross from the first component interposer 50 to the second component interposer 52, or vice versa.

Figure 4:
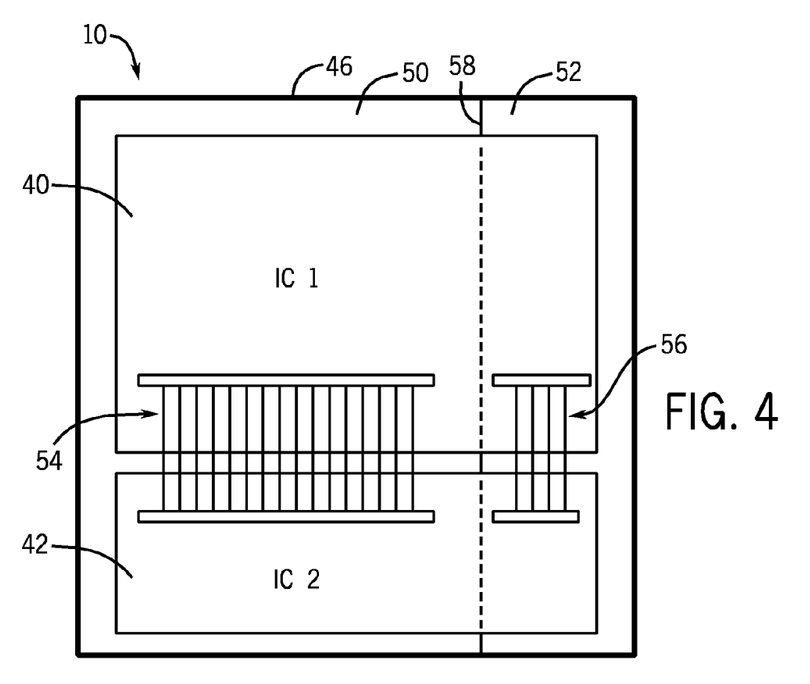
FIG. 4 is a top view of a block diagram of the high-capacity integrated circuit device, illustrating a way that the component integrated circuits communicate using chip-to-chip interconnects localized to each component interposer, in accordance with an embodiment.

As seen in a top view of the high-capacity integrated circuit device 10 shown in FIG. 4, the component integrated circuits 40 and 42 may be bonded on top of the stitched silicon interposer 46. The portions of the component integrated circuits 40 and 42 that are disposed over the first component interposer 50 communicate via the chip-to-chip interconnects 54. Likewise, portions of the component integrated circuits 40 and 42 that are disposed over the second component interposer 52 communicate via the chip-to-chip interconnects 56. Since the die seal structure 58 prevents chip-to-chip interconnects between the two component interposers 50 and 52, the component integrated circuits 40 and 42 may be designed to avoid needing such communication. For example, the component integrated circuits 40 and 42 may be designed to include internal communication channels to pass data horizontally, over the die seal structure 58 separating the two component interposers 50 and 52.

Figure 5:
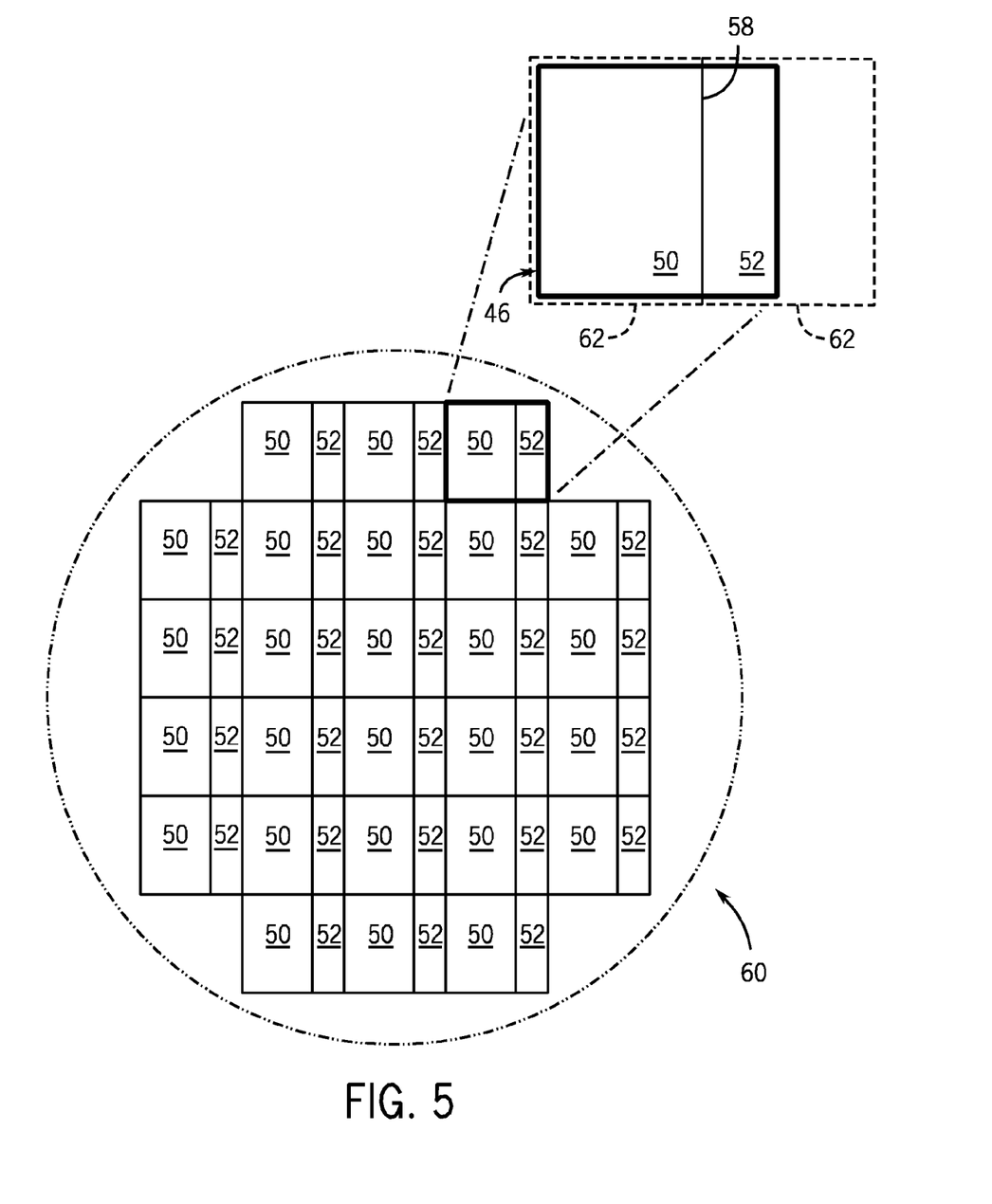
FIG. 5 is a schematic diagram of a silicon wafer on which the interposer is patterned, in accordance with an embodiment.

The stitched silicon interposer 46 may be formed on a silicon wafer 60, as shown in FIG. 5. In the example of FIG. 5, the first component interposer 50 is shown to be equal to or less than a reticle limit 62 of the lithography system used to pattern the stitched silicon interposer 46 on the silicon wafer 60. The second component interposer 52 is shown to be smaller than the reticle limit 62. In some embodiments, the lithography system may be 20 nm and the reticle limit 62 of the lithography system may be approximately 26 mm×32 mm. As such, the combination of the first and second component interposers 50 and 52 may exceed 26 mm×32 mm when the 20 nm lithography system is used.

In other examples, the stitched silicon interposer 46 may be formed from additional component interposers than only the component interposers 50 and 52. In any case, the component interposers may, individually, fall within than the size of the reticle limit 62. The entirety of the component interposers (e.g., the component interposers 50 and 52) that make up the stitched silicon interposer 46 may be larger than the reticle limit 62. In alternative embodiments, the stitched silicon interposer 46 may be smaller than the reticle limit 62, but still may include two or more component interposers that are separated from one another via the die seal structure 58.

Figure 6:
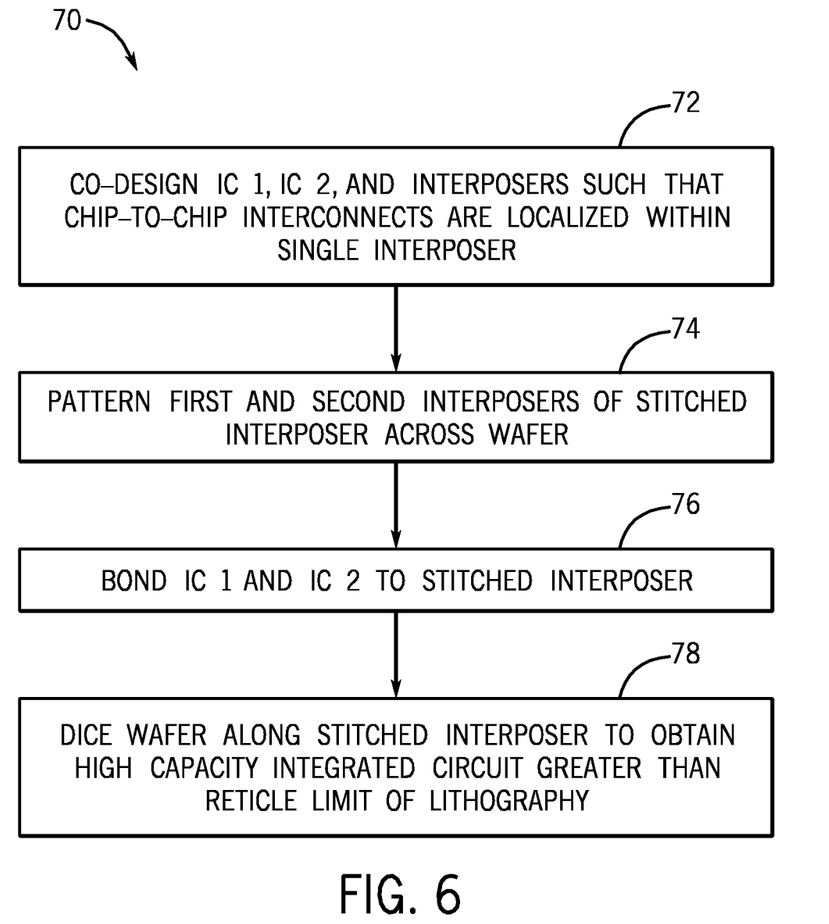
FIG. 6 is a flowchart of a method for manufacturing the high-capacity integrated circuit, in accordance with an embodiment.

Keeping the example of FIG. 5 in mind, a flowchart 70 of FIG. 6 illustrates a manner of manufacturing the high-capacity integrated circuit device 10 through chip-on-wafer (CoW) manufacturing. The flowchart 70 begins by when the first component integrated circuit (IC 1) 40, the second component integrated circuit (IC 2) 42, the first component interposer 50, and the second component interposer 52 are co-architected (block 72). Namely, the component integrated circuits 40 and 42 may be co-architected with the component interposers 50 and 52 to permit communication despite the chip-to-chip interconnects 54 and 56 will be localized within respective component interposers 50 and/or 52.

Using any suitable lithography system (e.g., a 20 nm lithography system), the first and second component interposers 50 and 52 may be patterned across the wafer 60. In some embodiments, all of the first component interposers 50 may first be patterned using a first interposer mask database, before patterning the second component interposer 52 using a second interposer mask database (block 74). In other examples, the first and second component interposers 50 and 52 may be patterned alternatingly across the wafer 60. As mentioned above, the interposer mask databases used to pattern the first and second component interposers 50 and 52, respectively, may be the same or may be different. The interposer mask databases used to pattern the first and second component interposers 50 and 52 may depend on the design of the component integrated circuits 40 and 42. Specifically, the interposer mask databases used to pattern the first and second component interposers 50 and 52 describe the chip-to-chip interconnects 54 and 56 to enable communication between the component integrated circuits 40 and 42.

Having patterned the stitched interposers 46 across the wafer 60, the component integrated circuits 40 and 42 may be bonded to the wafer (block 76). Moreover, the component integrated circuits 40 and 42 may have their interfaces underfilled and post-processed to reveal through-silicon vias (TSVs) (e.g., the TSVs 48 shown in FIG. 2). The C4 bumps 49 on the underside of the stitched silicon interposer 46 may also be formed. Thereafter, the wafer 60 may be diced along the periphery stitched silicon interposer 46 (block 78). By doing so, high-capacity integrated circuits 10 with sizes greater than the reticle limit 62 can be obtained.

Figure 7:
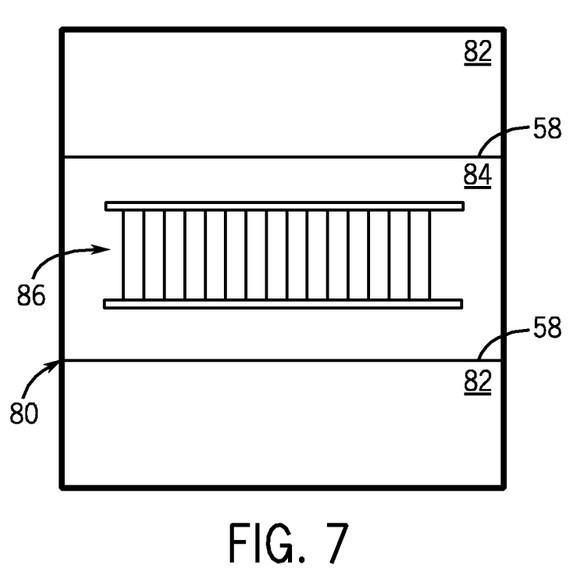
FIG. 7 is a top view of a block diagram of an interposer with three component interposers, in accordance with an embodiment.

Other configurations of the high-capacity integrated circuit device 10 are possible. For example, as shown in FIG. 7, a stitched silicon interposer 80 may include two first component interposers 82 and a single second component interposer 84. In the example of FIG. 7, the first component interposers 82 are disposed on either side of the second component interposer 84 and separated by die seal structures 58. Chip-to-chip interconnects 86 may be present at least in the second component interposer 84.

Figure 8:
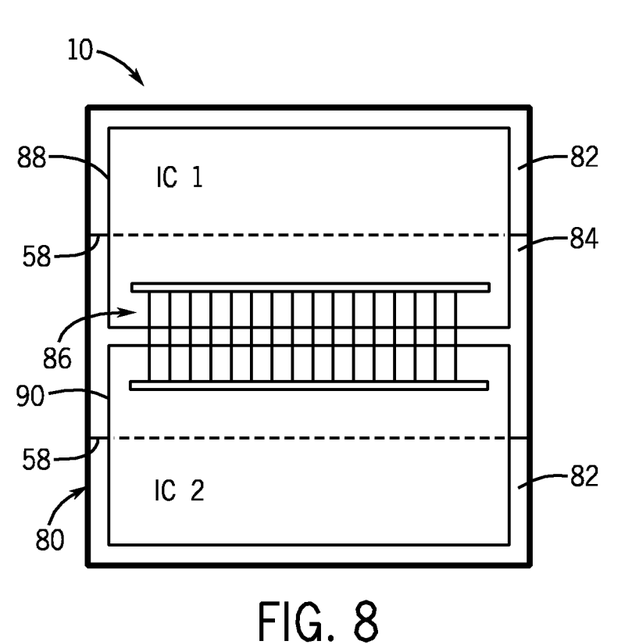
FIG. 8 is a top view of a high-capacity integrated circuit device that uses the interposer of FIG. 7, in accordance with an embodiment.

Indeed, as seen in FIG. 8, a first component integrated circuits (IC 1) 88 and a second component integrated circuit (IC 2) 90 may be disposed onto the stitched silicon interposer 80. In this configuration, the component integrated circuits 88 and 90 may intercommunicate using only the chip-to-chip interconnects 86 of the second component interposer 84. As such, in some embodiments, the first component interposers 82 even may be free of chip-to-chip interconnects. Nevertheless, the overall size of the stitched silicon interposer 80 may be larger than the reticle limit. For example, the second component interposer 84 may be of a size approximately equal to the reticle limit. Using the first component interposers 82 may expand the total size of the stitched silicon interposer 80 to exceed the reticle limit. Furthermore, when no chip-to-chip interconnects are patterned in the first component interposers 82, the yield of the stitched silicon interposer 80 may be substantially equal to the yield of the second component interposer 84 (i.e., higher than otherwise). It should be understood, however, that the first component interposers 82 may include their own interconnects in other embodiments.

The above discussion has been provided by way of example. Indeed, the embodiments of this disclosure may be susceptible to a variety of modifications and alternative forms. Indeed, many other suitable forms of high-capacity integrated circuits can be manufactured according to the techniques outlined above. For example, other high-capacity integrated circuit devices may include more than two component interposers in a stitched silicon interposer. The high-capacity integrated circuit devices may include more than two component integrated circuit devices. Some component interposers may have fewer or no chip-to-chip interconnects. Indeed, any number of integrated circuit devices may be developed that use a stitched silicon interposer formed by two or more component interposers using these techniques. Finally, the claims provided below are not intended to be limited to the particular forms disclosed, but rather to cover all modifications, equivalents, and alternatives falling within the spirit and scope of this disclosure.

What is claimed is:

1. An integrated circuit device comprising:
   first and second component integrated circuits that communicate with one another via first chip-to-chip interconnects and via second chip-to-chip interconnects; and
   a contiguous interposer comprising the first and second chip-to-chip interconnects to facilitate communication between the first and second component integrated circuits, wherein the interposer is larger than a reticle limit of a lithography system used to manufacture the interposer, and wherein the contiguous interposer comprises:
      a first component interposer comprising the first chip-to-chip interconnects;
      a second component interposer comprising the second chip-to-chip interconnects; and
      a die seal structure disposed between the first component interposer from the second component interposer through which no chip-to-chip interconnects cross:
   wherein:
      the first component integrated circuit is disposed over the first component interposer and the second component interposer and is electrically coupled to the first chip-to-chip interconnects and the second chip-to-chip interconnects; and
      the second component integrated circuit is disposed over the first component interposer and the second component interposer and is electrically coupled to the first chip-to-chip interconnects and the second chip-to-chip interconnects.

2. The integrated circuit device of claim 1, wherein neither the first component interposer nor the second component interposer is individually larger than the reticle limit.

3. The integrated circuit device of claim 1, wherein each of the chip-to-chip interconnects of the interposer is respectively disposed entirely within the first component interposer or entirely within the second component interposer, such that none of the chip-to-chip interconnects crosses between the first component interposer and the second component interposer.

4. The integrated circuit device of claim 1, wherein the first component interposer and the second component interposer have identical chip-to-chip interconnect designs.

5. The integrated circuit device of claim 1, wherein the first component interposer and the second component interposer each have different respective chip-to-chip interconnect designs.

6. An integrated circuit device comprising:
   a first integrated circuit device;
   a daughter die configured to support the first integrated circuit device; and
   an interposer configured to provide first chip-to-chip interconnects and second chip-to-chip interconnects between the first integrated circuit device and the daughter die, wherein the interposer comprises at least two non-overlapping component interposers separated from one another by a die seal structure, a first of the at least two component interposers containing the first chip-to-chip interconnects and a second of the at least two component interposers containing the second chip-to-chip interconnects;
   wherein the first integrated circuit device is disposed over the first of the at least two component interposers and the second of the at least two component interposers and electrically coupled to the first chip-to-chip interconnects and the second chip-to-chip interconnects; and
   wherein the daughter die is disposed over the first of the at least two component interposers and the second of the at least two component interposers and electrically coupled to the first chip-to-chip interconnects and the second chip-to-chip interconnects.

7. The integrated circuit device of claim 6, wherein the first integrated circuit device comprises a field programmable gate array and wherein the daughter die comprises another field programmable gate array, a memory device, an analog to digital converter, a digital to analog converter, a mixed signal processor, an optical signal processor, a microprocessor, or any combination thereof.

8. The integrated circuit device of claim 6, wherein the interposer comprises at least three non-overlapping component interposers.

9. The integrated circuit device of claim 8, wherein at least two of the at least three non-overlapping component interposers comprise identical chip-to-chip interconnect structures.

10. The integrated circuit device of claim 9, wherein at least one of the at least three non-overlapping component interposers is different from the at least two overlapping component interposers that identical chip-to-chip interconnect structures.

11. The integrated circuit device of claim 6, wherein the interposer is larger than a reticle limit of a lithography system used to manufacture the interposer but each of the at least two component interposers is equal to or smaller than the reticle limit.

12. An integrated circuit device comprising:
   a contiguous stitched interposer comprising:
      a first component interposer comprising first chip-to-chip interconnects;
      a second component interposer comprising second chip-to-chip interconnects; and a die seal structure disposed between the first component interposer from the second component interposer through which no chip-to-chip interconnects cross;

a first component integrated circuit disposed over the first component interposer and the second component interposer and electrically coupled to the first chip-to-chip interconnects and the second chip-to-chip interconnects; and a second component integrated circuit disposed over the first component interposer and the second component interposer and electrically coupled to the first chip-to-chip interconnects and the second chip-to-chip interconnects;

wherein the first and second component integrated circuits are configured to communicate with one another via the first chip-to-chip interconnects and the second chip-to-chip interconnects.

13. A system comprising:

a processor; and an integrated circuit device configured to operate on data from the processor, wherein the integrated circuit device comprises at least two component integrated circuits configured to intercommunicate via a stitched interposer that comprises at least two component interposers with non-overlapping respective sets of chip-to-chip interconnects, wherein a first of the at least two component interposers comprises a first set of the chip-to-chip interconnects and a second of the at least two component interposers comprises a second set of the chip-to-chip interconnects, and wherein a first of the at least two component integrated circuits is disposed over the first of the at least two component interposers and the second of the at least two component interposers, a second of the at least two component integrated circuits is disposed over the first of the at least two component interposers and the second of the at least two component interposers, and wherein the first of the at least two component integrated circuits and the second of the at least two component integrated circuits communicate with each other via the first set of the chip-to-chip interconnects and the second set of the chip-to-chip interconnects.

14. The system of claim 13, wherein the system comprises a computer, a handheld electronic device, a portable phone, an industrial control system, or any combination thereof.

15. The system of claim 13, wherein the integrated circuit device has an area greater than a reticle limit of a lithography system used to pattern the at least two component interposers of the stitched interposer.

16. A silicon interposer configured to facilitate communication between a first integrated circuit chip and a second integrated circuit chip, comprising:

a first component interposer that has patterned therein a first set of chip-to-chip interconnects that facilitate communication between the first integrated circuit chip and the second integrated circuit chip when the first integrated circuit chip and the second integrated circuit chip are communicably attached onto the silicon interposer;

a second component interposer that has patterned therein a second set of chip-to-chip interconnects that also facilitate communication between the first integrated circuit chip and the second integrated circuit chip when the first integrated circuit chip and the second integrated circuit chip are communicably attached onto the silicon interposer; and a die seal structure that separates the first and second component interposers.

17. The silicon interposer of claim 16, wherein the first component interposer and the second component interposer comprise respective pluralities of chip-to-chip interconnects configured to provide communication channels to the two integrated circuit chips.

18. The silicon interposer of claim 16, wherein the first component interposer but not the second component interposer comprises a plurality of chip-to-chip interconnects configured to provide communication channels to the two integrated circuit chips.

19. A silicon interposer comprising features patterned using a 14 nm lithography system, wherein the silicon interposer exceeds 26 mm×32 mm and wherein the silicon interposer comprises:

a first component interposer that has patterned therein a first set of chip-to-chip interconnects that facilitate communication between a first integrated circuit and a second integrated circuit when the first integrated circuit and the second integrated circuit are communicably attached onto the silicon interposer;

a second component interposer that has patterned therein a second set of chip-to-chip interconnects that also facilitate communication between the first integrated circuit and the second integrated circuit when the first integrated circuit and the second integrated circuit are communicably attached onto the silicon interposer; and a die seal structure that separates the first and second component interposers.

\* \* \* \* \*